AUTOMATIC FREQUENCY CONTROL SYSTEM

Filed Oct. 26, 1945

*INVENTOR.*
ALBERT E. WHITFORD
*BY*
William D. Hall
ATTORNEY

Patented May 29, 1951

2,555,175

UNITED STATES PATENT OFFICE 2,555,175

AUTOMATIC FREQUENCY CONTROL SYSTEM

Albert E. Whitford, Belmont, Mass., assignor, by mesne assignments, to the United States of America as represented by the Secretary of War Application October 26, 1945, Serial No. 624,903

4 Claims. (Cl. 250—36)

This invention relates in general to radio apparatus and more specifically to a system for automatic frequency stabilization of oscillators and similar apparatus.

In many types of radio object-locating devices it is necessary to control the frequency of local oscillators so that the intermediate frequency, resulting from mixing the output of the local oscillator with the signal, will be constant. The frequency of the local oscillator tends to change because of load and temperature variations and other factors. It is sometimes desirable to change the frequency of the signal, thereby necessitating a change in frequency of the local oscillator so that the intermediate frequency will remain the same as before. The change in local oscillator frequency must be a rapid one, as in many radio object-locating devices the signal consists of recurring pulses of extremely short duration. When the local oscillator is producing an output of such a frequency that the resulting intermediate frequency does not have the desired value, a complete signal pulse or chain of pulses may be lost by attenuation in the intermediate-frequency stages unless an immediate correction of the local oscillator frequency is made.

It is an object of this invention to provide a novel means which will automatically stabilize the frequency of a thermally tuned local oscillator over a wide range of frequencies with no mechanical preselection of approximate frequency.

A further object is to provide a novel means for stabilizing the frequency of an I.-F. voltage.

Another object is to provide a means to control the frequency of an oscillator and to provide a second means which, should said first means fail to control said oscillator, will again place said first means in condition to control the frequency of said oscillator.

Generally, this invention comprises a discriminator connected to a trigger circuit. The output voltage of the trigger circuit is large or small depending on which tube of the trigger circuit is conducting. This voltage is used to change the voltage of the oscillator. During normal operation with control established, the trigger circuit alternates rapidly between its two stable conditions. If, however, control is lost, the output voltage will be constant and after a specified time a multivibrator circuit operates to reset the trigger circuit so that the oscillator will be restored to the proper frequency.

Figure 1:
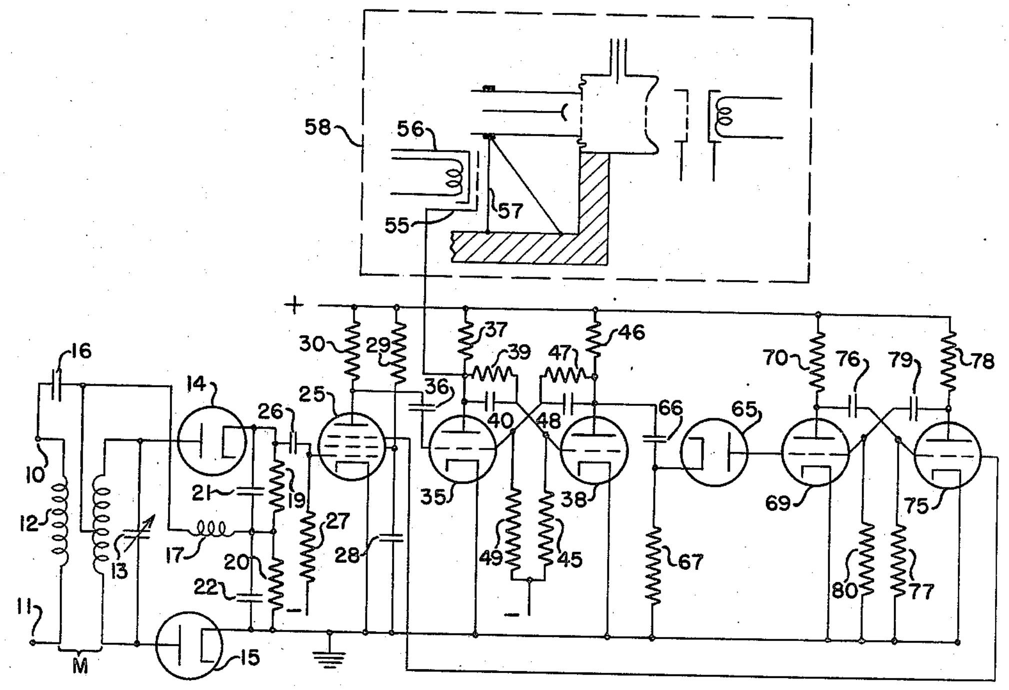
Figure 1:
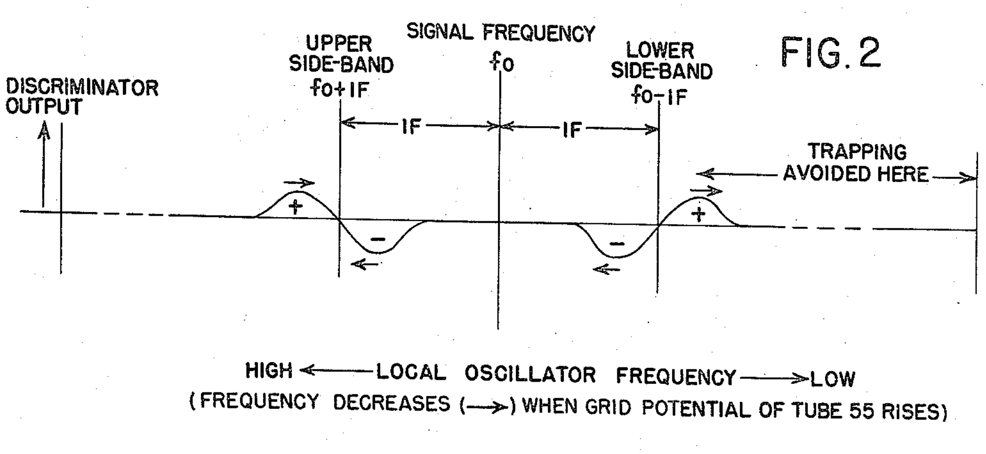

Other objects, features and advantages of this invention will suggest themselves to those skilled in the art and will become apparent from the following description of the invention taken in connection with the accompanying drawings in which:

Fig. 1 is a circuit diagram illustrating the principles embodied in this invention; and Fig. 2 is a chart which shows the relation between the local oscillator frequency and discriminator output.

Referring now more particularly to Fig. 1, input terminals 10 and 11 are connected to the primary of a transformer 12. The secondary of transformer 12 is connected across a capacitor 13 and its terminals are connected to the plates of diodes 14 and 15, respectively. Terminal 10 is also connected through a capacitor 16 to a center tap of the secondary of transformer 12 and also to one side of a choke 17. The cathodes of diodes 14 and 15 are connected together by resistors 19 and 20 in series. Capacitors 21 and 22 are also connected in series between the cathodes of tubes 14 and 15. The junction of resistors 19 and 20 is connected to the junction of capacitors 21 and 22 and also to the choke 17.

The cathode of diode 14 is connected to the first, or control, grid of a tube 25 through a capacitor 26. The control grid of tube 25 is connected to a source of negative potential (not shown) through a resistor 27. The cathode of tube 25 is grounded. The screen grid of tube 25 is connected to ground through a capacitor 28 and to a source of positive potential (not shown) through a resistor 29. The plate of tube 25 is connected to a positive potential source through a resistor 30 and to the grid of a tube 35 through a capacitor 36. The plate of tube 35 is connected to a source of positive potential through a resistor 37 and to the grid of a tube 38 through the parallel combination of a resistor 39 and a capacitor 40. The plate of tube 35 is also connected to a grid 55 which controls the electron flow from a cathode 56 to a strut 57 connected to the cavity resonator of an oscillator tube 58. Strut 57 is heated by the current passing through it and is arranged to expand or contract with changes of temperature. Expansion or contraction of strut 57 alters the tuning of the cavity resonator and changes the frequency of the oscillator.

The grid of tube 38 is connected to a source of negative potential through resistor 45. The cathodes of tubes 35 and 38 are grounded. The plate of tube 38 is connected to a source of positive potential through a resistor 46 and to the grid of tube 35 through the parallel combination of resistor 47 and capacitor 48. The grid of tube 35 is connected to a source of negative potential through resistor 49.

The plate of tube 38 is also connected to the cathode of a diode tube 65 through a capacitor 66. The cathode of tube 65 is also connected to ground through a resistor 67. The plate of tube 65 is connected directly to the grid of a tube 69. The plate of tube 69 is connected to a source of positive potential through a resistor 70, and to the grid of tube 75 through a capacitor 76. The grid of tube 75 is connected to ground through a resistor 77 and is also connected directly to the suppressor grid of tube 25. The plate of tube 75 is connected to a source of positive potential through a resistor 78 and to the grid of tube 69 through a capacitor 79. The grid of tube 69 is connected to ground through a resistor 80. The cathodes of tubes 69 and 75 are connected to ground.

In operation, the I.-F. voltage whose frequency is to be controlled is applied across terminals 10 and 11. This I.-F. voltage is obtained by heterodyning a radio-frequency voltage with a local oscillator voltage. Diodes 14 and 15, operating in conjunction with the associated apparatus, produce a voltage output across their cathodes. The polarity and magnitude of this output voltage are functions of the discrepancies of the frequency of the incoming voltage in relation to the frequency of the tuned circuit, consisting of transformer 12 and capacitor 13. This is conventional discriminator action, the operation of which is explained, for example, on pages 585, 586 and 587 of the "Radio Engineer's Handbook" by F. E. Terman, published by McGraw-Hill Book Company, Inc., in 1943.

The output voltage from the discriminator is applied to the first grid of tube 25 through capacitor 26. Tube 25 serves as an inverter, and its output voltage is taken from its plate and applied to a trigger circuit composed of tubes 35 and 38 and associated apparatus. Said trigger circuit has two stable operating conditions, that is, with either tube 35 conducting and tube 38 nonconducting, or tube 38 conducting and tube 35 nonconducting. When said trigger circuit is operated by a pulse of one polarity, it is insensitive to further pulses of the same polarity and will change operating conditions, that is, cause the previously conducting tube to cease conducting and the previously nonconducting tube to conduct, only in response to a pulse of the opposite polarity.

The voltage output from the trigger circuit is taken from the plate of tube 35 and is applied to grid 55 of oscillator tube 58. Thus, the frequency of oscillator tube 58 is increased or decreased depending upon whether tube 35 is nonconducting or conducting.

Tubes 69 and 75 operate in conjunction with the associated apparatus as a multivibrator. This conventional multivibrator action is explained, for example, on page 182 of "Ultra High Frequency Techniques" by J. G. Brainerd, et al., published by D. Van Nostrand & Company, Inc., in 1942. The multivibrator is connected so that it will be held in one of its stable conditions, that is, with tube 69 not conducting, when the trigger circuit is rapidly alternating between its two stable positions. This stabilization of the multivibrator is accomplished by applying the fluctuating output voltage of tube 38 to the cathode of tube 65 through capacitor 66. The plate of tube 65 is connected to ground through resistor 80 and to a positive potential source through capacitor 79 and resistor 78. When tube 38 is conducting current flows through tube 65 causing a low potential to appear at the plate of tube 65. The capacitance in the circuit prevents a rapid rise of the potential when tube 38 is not conducting, as the time constant of the circuit is long unless tube 65 is conducting. This low potential is applied directly to the grid of tube 69, thus insuring that tube 69 will not be conducting and, conversely, that tube 75 will be in a conducting state, when the trigger circuit, composed of tubes 35 and 38, is rapidly alternating between its two stable conditions.

When tube 75 is conducting its grid potential is high and, as this potential is applied to the suppressor grid of tube 25, plate current will flow in tube 25. When tube 69 is permitted to conduct, a low potential is applied to the grid of tube 75 and to the suppressor grid of tube 25. This potential is sufficiently low so that the plate of tube 25 is insensitive to pulses appearing upon its control grid.

Referring now to Fig. 2, a chart is given in which the discriminator output is plotted as a function of the local oscillator frequency. It will be noted that there are two side bands symmetrically located about the signal frequency, $f_0$, as would be expected. The chart is plotted to represent the local oscillator frequency increasing from right to left. Most thermally controlled oscillating tubes oscillate at their highest frequency with a cold tuning strut and the frequency decreases when power is applied to this tuning strut; the chart is thus plotted with increasing power causing the frequency to go from left to right.

When the local oscillator and control circuits are initially operated, the trigger circuits and the multivibrator circuits start at random; that is, it cannot be predicted as to which tube will be conducting and which tube will be nonconducting.

There are four conditions which may be encountered when the circuits are initially operated, namely:

1. In the trigger circuit tube 35 may be nonconducting and tube 38 conducting, and in the multivibrator circuit tube 69 may be nonconducting and tube 75 conducting. Under these conditions a high potential is applied to grid 55, causing the tuning strut to heat and thus decreasing the local oscillator frequency. The frequency of the local oscillator decreases until it reaches the upper side band. Inasmuch as tube 25 is in a conducting state when tube 75 is conducting, the negative pulse from the discriminator causes the tube 35 to conduct, thus permitting the tuning strut to cool, which increases the frequency until the discriminator produces a positive pulse. Thus, it is seen that the local oscillator frequency is trapped at the center of the upper side band. When the local oscillator frequency is trapped, the multivibrator is held stable with tube 75 conducting as previously explained.

2. Another condition which may exist is that the trigger circuit tube 35 is nonconducting and tube 38 is conducting, while the multivibrator circuit tube 69 is conducting and tube 75 is nonconducting. In this instance the local oscillator frequency decreases and as tube 25 draws no plate current, the discriminator pulses have no effect. Consequently the frequency decreases until the multivibrator circuit "flips over." This causes a negative pulse to appear on tube 35. However, tube 35 under these conditions is already in a nonconducting state. Therefore, no change occurs in the trigger circuit. When the multivibrator, which is free-running unless the local oscillator frequency is trapped, again "flips over" a positive pulse appears on the grid of tube 35 causing tube 35 to conduct and tube 38 to stop conducting. Thus, the frequency of the local oscillator will increase. However, the suppressor grid of tube 25 is again at a low potential and the discriminator pulses do not affect the trigger circuit. Thus the frequency of the local oscillator increases above the upper side band and until the multivibrator again "flips over," at which time the local oscillator frequency will decrease, until a negative pulse is applied to the grid of tube 35. However, at this time tube 25 is conducting and the discriminator pulses will have an effect upon the trigger circuit causing the local oscillator frequency to become trapped.

3. When the trigger circuit is in such a condition that tube 35 is conducting and tube 38 nonconducting, and the multivibrator circuit is conditioned so that tube 69 is conducting and tube 75 is nonconducting, the tuning strut 57 will have no power applied to it as the plate of tube 35 is at low potential when it is conducting, and the local oscillator frequency therefore remains high until the multivibrator circuit "flips over." This action causes a negative pulse to appear on the grid of tube 35, thus causing it to cease conducting and tube 38 to conduct. The local oscillator frequency then decreases, and, as tube 25 is conducting plate current, the local oscillator frequency becomes trapped at the upper side band.

4. The trigger circuit may have its tube 35 conducting and tube 38 nonconducting, while the multivibrator circuit has its tube 69 nonconducting and tube 75 conducting. Under these conditions the local oscillator frequency remains high until the multivibrator circuit "flips over" twice. The second time the multivibrator "flips over" the negative pulse appears on grid of tube 35, which causes the local oscillator frequency to decrease until trapped at the upper side band frequency.

When the oscillator frequency has become trapped at the proper value it will remain at that frequency due to the action of the present invention. If, for any reason, such as a signal failure, the oscillator frequency is not properly controlled the oscillator will continue to change frequency in the direction that it was last triggered by the discriminator circuit. After a predetermined interval of time the multivibrator circuit changes between its two stable conditions and reverses the direction of frequency sweep of the local oscillator. It is obvious that the time between multivibrator "reversals" must be longer than the time required for the local oscillator to sweep throughout its range. It will be noted that the trigger circuit is insensitive to discriminator pulses when the multivibrator circuit "flips over" causing the local oscillator frequency to increase. When the multivibrator circuit "flips over" again, the local oscillator frequency will decrease until it becomes trapped at the desired frequency.

While there has been described what is at present considered to be the preferred embodiment of this invention, it will be obvious to those skilled in the art that various changes and modifications may be made therein without departing from the scope of the invention as set forth in the appended claims.

The invention claimed is:

1. In combination with means for receiving a radio signal, an oscillator tube including thermal means for controlling the oscillator frequency, a frequency discriminator having means to receive a beat frequency between the aforementioned oscillator frequency and a signal frequency, said discriminator being tuned to a predetermined frequency to produce a voltage output of one polarity if the beat frequency is above said predetermined frequency and of the opposite polarity if the beat frequency is below said predetermined frequency, a first electronic discharge device having a multiple number of elements and so arranged in relation to said discriminator that the voltage output from said discriminator applied to one of said elements has an effect upon the current flow of a second of said elements when the voltage potential of the third of said elements is high and further arranged so that the voltage output from said discriminator has no effect upon the current flow of said second element when the voltage potential of said third element is low, a trigger circuit including second and third electronic discharge devices arranged so that when said one element of said first electronic discharge device has an effect upon the current flow of said second element one of said second and third electronic discharge devices conducts when said discriminator has an output of one polarity and the other of said second and third electronic discharge devices conducts when the output of said discriminator is of the opposite polarity, said trigger circuit having a high and low voltage output depending upon which of said second or third electronic discharge devices is conducting, means whereby the frequency of said oscillator tube is controlled by the output of said trigger circuit, a multivibrator having two electronic discharge devices, means connecting said multivibrator to said first electronic discharge device so that when one electronic discharge device of said multivibrator is conducting said third element of said first electronic discharge device is at high voltage potential and when the other electronic discharge device conducts current said third element of said first electronic discharge device is at low voltage potential, means connected to said trigger circuit for deriving a bias voltage when said trigger circuit rapidly alternates between its two stable conditions, and means for applying said bias voltage to said multivibrator to maintain said multivibrator in one of its conditions.

2. In an apparatus for automatically controlling the frequency of an input signal supplied by a source thereof, a first means responsive to said input signal for producing an output of one polarity when the frequency of the input signal is within a first range above a predetermined frequency value and for producing an output of another polarity when the input frequency is within a second range below said predetermined frequency value, a second means alternatively adjustable to either of two stable conditions, a third means responsive to the output of said first means when said second means is in a particular one of its two stable conditions, said third means when responsive to said first means having an output of opposite polarity relative to that of said first means, a fourth means responsive to the output of said third means and controlling said signal source to vary the input frequency in alternative directions relative to the desired frequency level depending upon the polarity of the output of said first means, and a fifth means which controls said second means insuring that said second means is in one of its two stable conditions when said third means has a voltage output of varying magnitude whereby when said input signal is not within a predetermined frequency range said second means produces a voltage output which controls said third means whereby frequency control is established.

3. In combination, an oscillator having means for controlling the frequency of oscillation thereof, a discriminator, means for applying a signal to said discriminator for producing a voltage output the magnitude and polarity of which is a function of the frequency of the oscillator, an amplifier connected to the output of said discriminator, a multivibrator having a free running rate between two conditions of operation, means for keying said amplifier with the output of said multivibrator so that said amplifier produces an output only when said multivibrator is in one of its two conditions, a trigger circuit connected to said amplifier, said trigger circuit having an output circuit connected to said means for controlling the frequency of said oscillator, control means connected between said trigger circuit and said multivibrator for deriving a bias voltage when said trigger circuit is being triggered at a rate greater than a predetermined frequency rate for controlling said multivibrator so that it remains in said one of its two conditions, whereby said multivibrator is free to oscillate at its free running rate when said trigger circuit is not triggered at a rate greater than the said predetermined frequency rate.

4. In combination, an oscillator having first means for controlling the frequency of oscillation thereof, second means for producing a voltage output the magnitude and polarity of which is a function of the frequency of the oscillator, an amplifier connected to the output of said second means, a multivibrator having a free running rate between two conditions of operation, means for keying said amplifier with the output of said multivibrator so that said amplifier produces an output only when said multivibrator is in one of its two conditions, a trigger circuit connected to said amplifier, said trigger circuit having an output circuit connected to said first means, control means connected between said trigger circuit and said multivibrator for deriving a bias voltage when said trigger circuit is being triggered at a rate greater than a predetermined frequency rate for controlling said multivibrator so that it remains in said one of its two conditions, whereby said multivibrator is free to oscillate at its free running rate when said trigger circuit is not triggered at a rate greater than the said predetermined frequency rate.

ALBERT E. WHITFORD.

REFERENCES CITED

The following references are of record in the file of this patent:

UNITED STATES PATENTS

| Number | Name | Date |
|---|---|---|
| 2,135,946 | Mountjoy | Nov. 8, 1938 |